(12) United States Patent
Na

(10) Patent No.: US 9,324,395 B2
(45) Date of Patent: Apr. 26, 2016

(54) DATA SENSING CIRCUIT OF SEMICONDUCTOR APPARATUS

(71) Applicant: SK hynix Inc., Icheon-si Gyeonggi-do (KR)

(72) Inventor: One Gyun Na, Icheon-si (KR)

(73) Assignee: SK hynix Inc., Incheon-si, Gyeonggi-do (KR)

( * ) Notice: Subject to any disclaimer, the term of this patent is extended or adjusted under 35 U.S.C. 154(b) by 3 days.

(21) Appl. No.: 14/248,801

(22) Filed: Apr. 9, 2014

(65) Prior Publication Data

US 2015/0187400 A1 Jul. 2, 2015

(30) Foreign Application Priority Data

Dec. 30, 2013 (KR) .................. 10-2013-0166997

(51) Int. Cl.
*G11C 7/00* (2006.01)
*G11C 7/22* (2006.01)
*G11C 7/06* (2006.01)
*G11C 7/10* (2006.01)
*G11C 7/12* (2006.01)

(52) U.S. Cl.
CPC *G11C 7/22* (2013.01); *G11C 7/065* (2013.01); *G11C 7/1051* (2013.01); *G11C 7/1063* (2013.01); *G11C 7/12* (2013.01); *G11C 2207/12* (2013.01)

(58) Field of Classification Search
CPC ............ G11C 7/22; G11C 7/065; G11C 7/12; G11C 7/1051; G11C 7/1063; G11C 2207/12
USPC ........................................ 327/55; 365/189.05
See application file for complete search history.

(56) References Cited

U.S. PATENT DOCUMENTS

| 7,616,513 B1 * | 11/2009 | Peng et al. ..................... 365/207 |
| 8,223,568 B2 * | 7/2012 | Seo ................................ 365/203 |
| 2006/0250162 A1 * | 11/2006 | Kim et al. ........................ 327/55 |
| 2010/0157702 A1 * | 6/2010 | Seo ................................ 365/194 |

FOREIGN PATENT DOCUMENTS

KR 100546284 B1 1/2006

* cited by examiner

*Primary Examiner* — Han Yang
*Assistant Examiner* — Xiaochun L Chen
(74) *Attorney, Agent, or Firm* — William Park & Associates Ltd.

(57) ABSTRACT

A data sensing circuit of a semiconductor apparatus includes a sensing unit configured to drive a pair of output lines based on a voltage level difference between a pair of input/output lines in response to a pair of enable signals, a timing control unit configured to perform an equalizing operation between the pair of output lines while the pair of enable signals are in a deactivated state in response to a control signal, and to interrupt the equalizing operation between the pair of output lines when a predetermined period of time has passed following the activation of the pair of enable signals, and a control signal generation unit configured to generate the control signal in response to the enable signal.

18 Claims, 5 Drawing Sheets

300

400

DATA SENSING CIRCUIT OF SEMICONDUCTOR APPARATUS

CROSS-REFERENCES TO RELATED APPLICATION

The present application claims priority under 35 U.S.C. §119(a) to Korean application number 10-2013-0166997, filed on Dec. 30, 2013, in the Korean Intellectual Property Office, which is incorporated herein by reference in its entirety.

BACKGROUND

1. Technical Field

Various embodiments relate to a semiconductor apparatus, and more particularly, to a data sensing circuit of a semiconductor apparatus.

2. Related Art

A semiconductor apparatus includes various input/output lines that provide electrical coupling between a memory cell and a final output terminal. Examples of such input/output lines include, but are not limited to, a segment input/output line (SIO), a local input/output line (LIO) and a global input/output line (GIO).

The semiconductor apparatus may include a data sensing circuit for sensing data transmitted via the various input/output lines.

SUMMARY

In an embodiment, a data sensing circuit of a semiconductor apparatus may include a sensing unit configured to drive a pair of output lines based on a voltage level difference of a pair of input/output lines in response to a pair of enable signals, a timing control unit configured to perform an equalizing operation between the pair of output lines while the pair of enable signals are in a deactivated state in response to a control signal, and to interrupt the equalizing operation between the pair of output lines when a predetermined period of time has passed following the activation of the pair of enable signals, and a control signal generation unit configured to generate the control signal in response to the enable signal.

In an embodiment, a system may include a memory controller and a semiconductor memory device. The semiconductor memory device may include a data sensing circuit of a semiconductor apparatus may include a sensing unit configured to drive a pair of output lines based on a voltage level difference of a pair of input/output lines in response to a pair of enable signals, a timing control unit configured to perform an equalizing operation between the pair of output lines while the pair of enable signals are in a deactivated state in response to a control signal, and to interrupt the equalizing operation between the pair of output lines when a predetermined period of time has passed following the activation of the pair of enable signals, and a control signal generation unit configured to generate the control signal in response to the enable signal.

DETAILED DESCRIPTION

Various embodiments of a data sensing circuit of a semiconductor apparatus will be described below with reference to the accompanying drawings.

Figure 1:
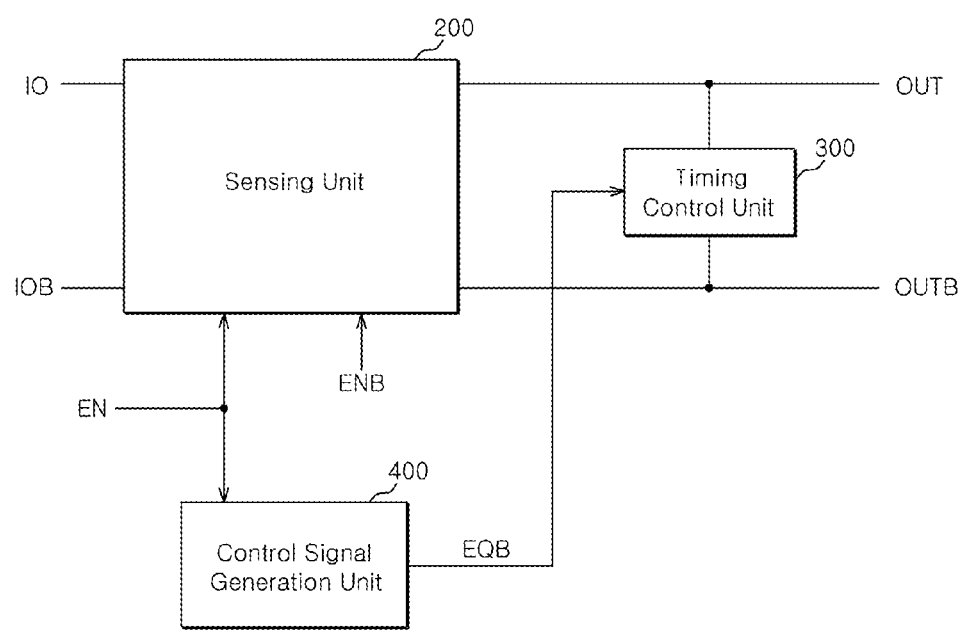
FIG. 1 is a block diagram representation of an embodiment of a data sensing circuit of a semiconductor apparatus.

As shown in FIG. 1, an embodiment of a data sensing circuit 100 of a semiconductor apparatus may include a sensing unit 200, a timing control unit 300, and a control signal generation unit 400.

The sensing unit 200 may be configured to drive a pair of output lines OUT, OUTB based on a difference in the level of a pair of input/output lines IO, IOB in response to a pair of enable signals EN, ENB.

The pair of input/output lines IO, IOB may be segment input/output lines (SIOs) or local input/output lines (LIOs).

When the pair of input/output lines IO, IOB are SIOs or LIOs, the pair of output lines OUT, OUTB may be LIOs or global input/output lines (GIOs).

The pair of input/output lines IO, IOB may be precharged to a voltage level before they are activated in accordance with a read or write command.

The precharge voltage level of the pair of input/output lines JO, IOB may be a voltage level corresponding to approximately one half of a power supply voltage VDD. The precharge voltage level of approximately one half of the power supply voltage may reduce current consumption.

The timing control unit 300 may be configured to perform an equalizing operation for the pair of output lines OUT, OUTB during a period when the pair of enable signals EN, ENB are deactivated and in response to a control signal EQB. The timing control unit 300 may be configured to interrupt the equalizing operation for the pair of output lines OUT, OUTB when a predetermined period of time has elapsed following the activation of enable signals EN, ENB.

The control signal generation unit 400 may be configured to generate the control signal EQB in response to the enable signal EN.

Figure 2:
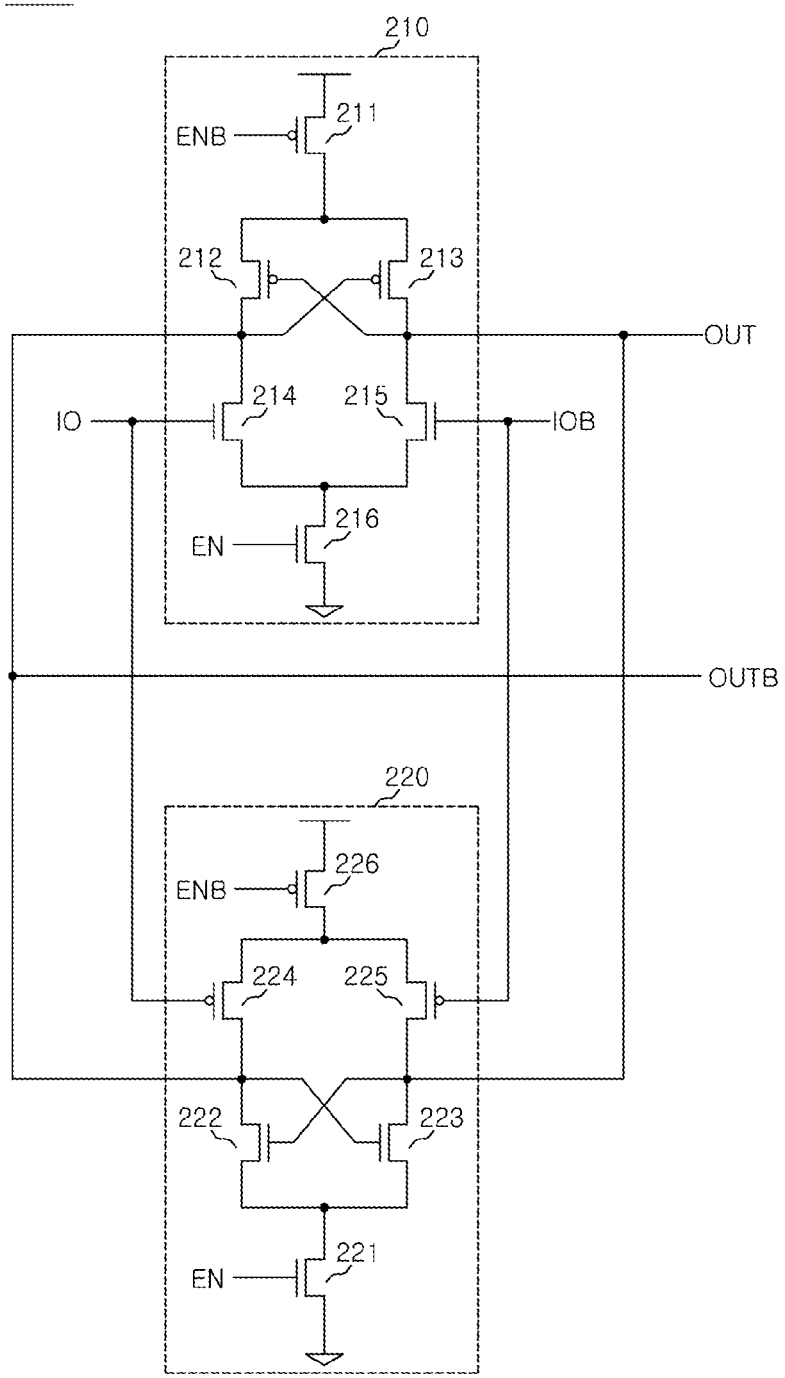
FIG. 2 is a circuit diagram of the sensing unit of FIG. 1.

As shown in FIG. 2, an embodiment of the sensing unit 200 may include a first sense amplifier 210 and a second sense amplifier 220.

The sensing unit 200 may be configured to sense high level data and low level data transmitted through the pair of input/output lines IO, IOB using the first sense amplifier 210 and the second sense amplifier 220.

The first sense amplifier 210 may be configured to sense the high level data transmitted through the pair of input/output lines IO, IOB.

The second sense amplifier 220 may be configured to sense the low level data transmitted through the pair of input/output lines IO, IOB.

The first sense amplifier 210 may be implemented using an N-type (NMOS type) semi-latch.

The N-type semi-latch may include first, second, third, fourth, fifth and sixth transistors 211, 212, 213, 214, 215, 216.

The source of the first transistor 211 is electrically coupled with a power supply terminal. The gate of the first transistor 211 is configured to receive the enable signal ENB.

The source of the second transistor 212 is electrically coupled to the source of the third transistor 213. The source of the second transistor 212 and the source of the third transistor 213 are electrically coupled with the drain of the first transistor 211. The gate of the second transistor 212 is electrically coupled to the output line OUT and the gate of the third transistor 213 is electrically coupled to the output line OUTB. The drain of the second transistor 212 is electrically coupled to the output line OUTB and the drain of the third transistor 213 is electrically coupled to the output line OUT.

The drain of the fourth transistor 214 is electrically coupled to the output line OUTB and the gate of the fourth transistor is electrically coupled to the input line IO.

The drain of the fifth transistor 215 is electrically coupled to the output line OUT and the gate of the fifth transistor 215 is electrically coupled to the input line IOB.

The drain of the sixth transistor 216 is electrically coupled to the source of the fourth transistor 214 and to the source of the fifth transistor 215. The gate of the sixth transistor 216 is configured to receive the enable signal EN. The source of the sixth transistor 216 is electrically coupled to a ground terminal.

The second sense amplifier 220 may be implemented using a P-type (PMOS type) semi-latch.

The -type semi-latch may include seventh, eighth, ninth, tenth, eleventh and twelfth transistors 221, 222, 223, 224, 225, 226.

The source of the seventh transistor 221 is electrically coupled to the ground terminal. The gate of the seventh transistor 221 is configured to receive the enable signal EN.

The source of the eighth transistor 222 is electrically coupled to the source of the ninth transistor 223. The source of the eighth transistor 222 and the source of the ninth transistor 223 are electrically coupled with the drain of the seventh transistor 221. The gate of the eighth transistor 222 is electrically coupled to the output line OUT and the gate of the ninth transistor 223 is electrically coupled to the output line OUTB. The drain of the eighth transistor 222 is electrically coupled to the output line OUTB and the drain of the ninth transistor 223 is electrically coupled to the output line OUT.

The drain of the tenth transistor 224 is electrically coupled to the output line OUTB. The gate of the tenth transistor 224 is electrically coupled to the input line IO.

The drain of the eleventh transistor 225 is electrically coupled to the output line OUT. The gate of the eleventh transistor 225 is electrically coupled to the input line IOB.

The drain of the twelfth transistor 226 is electrically coupled to the source of the tenth transistor 224 and to the source of the eleventh transistor 225. The gate of the twelfth transistor 226 is configured to receive the enable signal ENB. The source of the twelfth transistor 226 is electrically coupled with the power supply terminal.

The power supply terminal may be electrically coupled to an external power supply. The voltage level at the power supply terminal may be substantially similar to the voltage level of the external power supply. The voltage level of the external power supply may be, for example, VDD.

Figure 3:
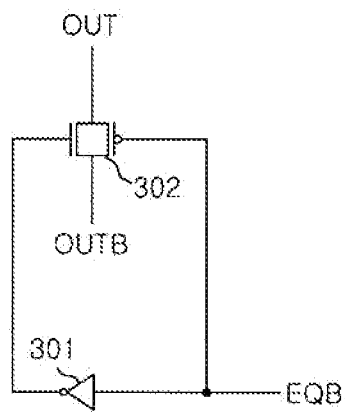
FIG. 3 is a circuit diagram of the timing control unit of FIG. 1.

As shown in FIG. 3, the timing control unit 300 may include an inverter 301 and a pass gate 302.

The inverter 301 is configured to receive the control signal EQB as an input and generate an inverted control signal EQB.

The pass gate 302 has a first end, a second end, a first control terminal and a second control terminal. The first end is electrically coupled with the output line OUT and the second end is electrically coupled with the output line OUTB. The first control terminal is configured to receive the control signal EQB as an input and the second control terminal is configured to receive the output of the inverter 301 as an input.

When the received control signal EQB has a low level, the pass gate 302 electrically couples the output line OUT with the output line OUTB thereby enabling the performance of an equalizing operation between output line OUT and output line OUTB. When the output line OUT has a first voltage and the output line OUTB has a second voltage, the performance of the equalizing operation results in the output lines OUT, OUTB both having a voltage level value approximately equal to a middle value between the value of the first voltage and the value of the second voltage.

When the received control signal EQB has a high level, the pass gate 302 disengages the electrical coupling between the output line OUT and the output line OUTB thereby interrupting the performance of the equalizing operation between the output lines OUT, OUTB.

While one configuration of a timing control unit 300 has been described, alternative configurations of the timing control unit may be employed.

Figure 4:
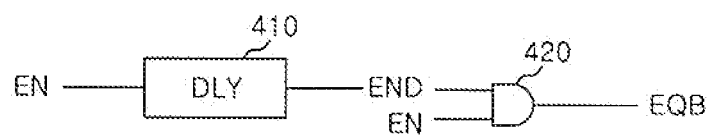
FIG. 4 is a circuit diagram of the control signal generation unit of FIG. 1.

As shown in FIG. 4, the control signal generation unit 400 may include a delay unit (DLY) 410 and a logic element 420.

The delay unit 410 may be configured to receive the enable signal EN as an input and generate a delayed enable signal END. The delayed enable signal END is generated a predetermined period of time following the receipt of the enable signal EN.

The logic element 420 may be configured to receive the delayed enable signal END and the enable signal EN as inputs. The logic element 420 may be configured to perform a AND operation on the received delayed enable signal END and the enable signal EN and output a result of the AND operation as the control signal EQB.

While one configuration of a control signal generation unit 400 has been described, alternative configurations of the control signal generation unit may be employed.

Operations of an embodiment of the data sensing circuit 100 of a semiconductor apparatus will be described below with reference to FIGS. 1 to 5.

The pair of input/output lines IO, IOB may be precharged to the voltage level corresponding to approximately one half of the power supply voltage VDD prior to the read or write command. The precharging of the pair of input/output lines IO, IOB to the voltage level corresponding to approximately one half of the power supply voltage VDD may reduce current consumption.

When a read command is received at the semiconductor apparatus, data is transmitted from a memory cell to the pair of input/output lines IO, IOB.

Figure 5:
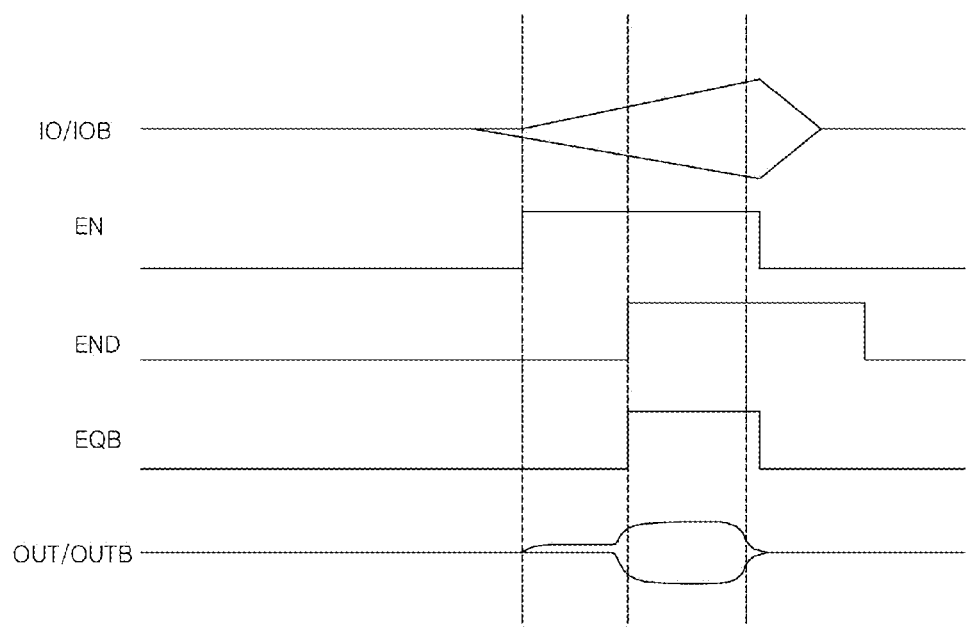
FIG. 5 is an operation timing diagram of an embodiment of the data sensing circuit of a semiconductor apparatus.

As shown in FIG. 5, the voltage difference between the pair of input/output lines IO, IOB may increase as a result of the charge sharing.

After the read command is received at the semiconductor apparatus, the pair of enable signals EN, ENB are activated to a high level and a low level, respectively, at a predetermined time in response to the received read command.

When the pair of enable signals EN, ENB are activated, the first sense amplifier 210 or the second sense amplifier 220 of the sensing unit 200 responsively senses and amplifies the voltage difference between the pair of input/output lines IO, IOB.

When the voltage difference between the pair of input/output lines IO, IOB is relatively large, the voltage difference between the pair of input/output lines IO, IOB may be increased by the charge sharing.

When the precharge level of the pair of input/output lines IO, IOB is relatively large, the voltage difference between the pair of input/output lines IO, IOB may be increased by the charge sharing.

The charge sharing is implemented in accordance with the read command, where the pair of input/output lines IO, IOB are precharged to a relatively low level. The relatively lower voltage level is approximately one half of the power supply voltage VDD and may reduce current consumption.

In an embodiment, in cases where there are relative lower voltage differences between the pair of input/output lines IO, IOB, where the pair of input/output lines charge share in accordance with a read command and have been precharged to a voltage level corresponding to approximately one half of the power supply voltage VDD, data may be sensed by their logic levels, using the first sense amplifier 210 and the second sense amplifier 220. The first and second sense amplifiers 210, 220 have semi-latch structures. In such a case, the sensing performance may be improved.

The sensing and the amplifying of the voltage difference between the pair of input/output lines IO, IOB is performed using the first sense amplifier 210 when high level data is outputted. The sensing and amplifying of the voltage difference between the pair of input/output lines IO, IOB is performed using the second sense amplifier 220 when low level data is outputted.

The control signal EQB is maintained at a low level prior to the enable signal EN being activated and for a predetermined period of time following the activation of the enable signal EN.

When the control signal EQB is at the low level, the timing control unit 300 electrically couples the pair of output lines OUT, OUTB, and thereby enabling the performance of the equalizing operation between the pair of output lines OUT, OUTB. When the output line OUT has a first voltage level and the output line OUTB has a second voltage level, the performance of the equalizing operation results in the output lines OUT, OUTB both having a voltage level value approximately equal to a middle value between the value of the first voltage level and the value of the second voltage level.

The timing control unit 300 is configured to interrupt the equalizing operation between the pair of output lines OUT, OUTB in response to the control signal EQB, when the control signal EQB transitions to the high level. The control signal EQB transitions to the high level when the predetermined period of time has elapsed following the activation of the enable signal EN.

As shown in FIG. 5, upon the interruption of the equalizing operation between the pair of output lines OUT, OUTB, the pair of output lines OUT, OUTB are driven to levels corresponding to the voltage difference between the pair of input/output lines IO, IOB, by the sensing unit 200.

Upon the activation of the enable signal EN, the voltage difference between the pair of input/output lines IO, IOB may be sensed, but the voltage level may be insufficient for amplification for driving the pair of output lines OUT, OUTB.

In an embodiment, after the voltage difference of the pair of input/output lines IO, IOB increases to a desired level (after the lapse of the predetermined period of time), the equalizing operation between the pair of output lines OUT, OUTB is interrupted so that the driving capability for the pair of output lines OUT, OUTB may be improved.

Figure 6:
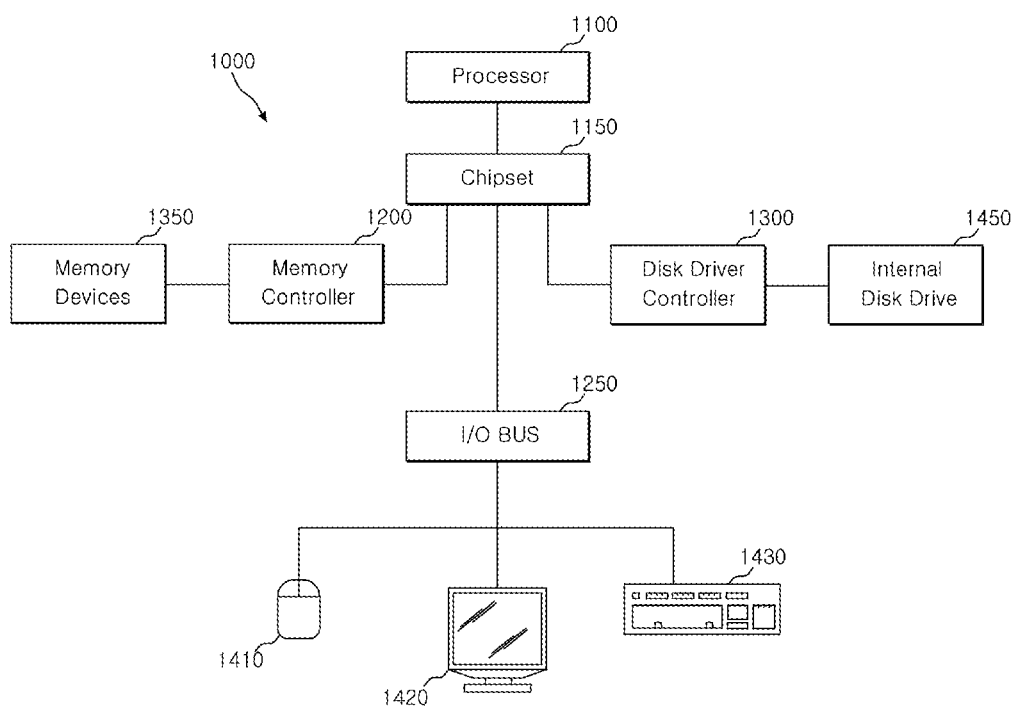
FIG. 6 is a block diagram representation of a system including a semiconductor apparatus including an embodiment of the data sensing unit.

Referring to FIG. 6, a block diagram representation of a system 1000 including an embodiment of a semiconductor device 1350 is shown. In an embodiment, the semiconductor device 1350 includes the data sensing circuit 100 of FIG. 1. In an embodiment, the semiconductor device 1350 is a semiconductor memory device. The system 1000 includes one or more semiconductor memory devices 1350 and a memory controller 1200.

Examples of the semiconductor memory device 1350 include, but are not limited to, dynamic random access memory, static random access memory, synchronous dynamic random access memory (SDRAM), synchronous graphics random access memory (SGRAM), double data rate dynamic ram (DDR), and double data rate SDRAM.

The memory controller 1200 is used in the design of memory devices, processors, and computer systems. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be electrically coupled to the CPU 1100. The chipset 1150 is a communication pathway for signals between the CPU 1100 and other components of the system 1000, which may include the memory controller 1200, an input/output ("I/O") bus 1250, and a disk drive controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system.

The memory controller 1200 may be electrically coupled to the chipset 1150. The memory controller 1200 can receive a request provided from the CPU 1100, through the chipset 1150. In alternate embodiments, the memory controller 1200 may be integrated into the chipset 1150. The memory controller 1200 may be electrically coupled to one or more memory devices 1350. The memory devices 1350 may be any one of a number of industry standard memory types, including but not limited to, single inline memory modules ("SIMMs") and dual inline memory modules ("DIMMs"). The memory devices 1350 may facilitate the safe removal of the external data storage devices by storing both instructions and data.

The chipset 1150 may be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. The I/O bus 1250 may be integrated into the chipset 1150.

The disk drive controller 1450 may also be electrically coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

The system 1000 described above in relation to FIG. 6 is merely one example of a system employing a semiconductor memory device 1350. In alternate embodiments, such as cellular phones or digital cameras, the components may differ from the embodiment shown in FIG. 6.

While certain embodiments have been described above, it will be understood to those skilled in the art that the embodiments described are by way of example only. Accordingly, the data sensing circuit of a semiconductor apparatus described herein should not be limited based on the described embodiments. Rather, the data sensing circuit of a semiconductor apparatus described herein should only be limited in light of the claims that follow when taken in conjunction with the above description and accompanying drawings.

What is claimed is:

1. A data sensing circuit of a semiconductor apparatus, comprising:
a sensing unit configured to drive a pair of output lines based on a voltage level difference between a pair of input/output lines in response to a pair of enable signals;
a timing control unit configured to perform an equalizing operation between the pair of output lines in response to a control signal, and to interrupt the equalizing operation between the pair of output lines when a predetermined period of time has passed following the activation of the pair of enable signals in response to the control signal; and
a control signal generation unit configured to generate the control signal in response to the pair of enable signals.

2. The data sensing circuit according to claim 1, wherein the sensing unit comprises:
a first sense amplifier configured to sense high level data being transmitted through the pair of input/output lines; and
a second sense amplifier configured to sense low level data being transmitted through the pair of input/output lines.

3. The data sensing circuit according to claim 2, wherein the first sense amplifier comprises an N-type (NMOS type) semi-latch and the second sense amplifier comprises a P-type (PMOS type) semi-latch.

4. The data sensing circuit according to claim 1, wherein the sensing unit uses an external power supply voltage as a power supply voltage.

5. The data sensing circuit according to claim 4, wherein the pair of input/output lines are precharged to a voltage level corresponding to approximately one half of the power supply voltage, before the pair of input/output lines are activated.

6. The data sensing circuit according to claim 1, wherein the pair of input/output lines comprise one of segment input/output lines and local input/output lines.

7. The data sensing circuit according to claim 6, wherein the pair of output lines comprise one of the local input/output lines and global input/output lines.

8. The data sensing circuit according to claim 1, wherein the timing control unit is configured to electrically couple the pair of output lines or electrically decouple the pair of output lines in response to the control signal.

9. The data sensing circuit according to claim 1, wherein the control signal generation unit is configured to generate the control signal in response to the pair of enable signals and a delayed signal, wherein the delayed signal is generated by delaying the pair of enable signals.

10. A system comprising:
a memory controller; and
a semiconductor memory device comprising:
a sensing unit configured to drive a pair of output lines based on a voltage level difference between a pair of input/output lines in response to a pair of enable signals;
a timing control unit configured to perform an equalizing operation between the pair of output lines in response to a control signal, and to interrupt the equalizing operation between the pair of output lines when a predetermined period of time has passed following the activation of the pair of enable signals in response to the control signal; and
a control signal generation unit configured to generate the control signal in response to the pair of enable signals.

11. The system according to claim 10, wherein the sensing unit comprises:
a first sense amplifier configured to sense high level data being transmitted through the pair of input/output lines; and
a second sense amplifier configured to sense low level data being transmitted through the pair of input/output lines.

12. The system according to claim 11, wherein the first sense amplifier comprises an N-type (NMOS type) semi-latch and the second sense amplifier comprises a P-type (PMOS type) semi-latch.

13. The system according to claim 10, wherein the sensing unit uses an external power supply voltage as a power supply voltage.

14. The system according to claim 13, wherein the pair of input/output lines are precharged to a voltage level corresponding to approximately one half of the power supply voltage, before the pair of input/output lines are activated.

15. The system according to claim 10, wherein the pair of input/output lines comprise one of segment input/output lines and local input/output lines.

16. The system according to claim 15, wherein the pair of output lines comprise one of the local input/output lines and global input/output lines.

17. The system according to claim 10, wherein the timing control unit is configured to electrically couple the pair of output lines or electrically decouple the pair of output lines in response to the control signal.

18. The system according to claim 10, wherein the control signal generation unit is configured to generate the control signal in response to the pair of enable signals and a delayed signal, wherein the delayed signal is generated by delaying the pair of enable signals.

* * * * *